US010911044B1

(12) United States Patent
    Jin

(10) Patent No.: US 10,911,044 B1
(45) Date of Patent: Feb. 2, 2021

(54) WIDE RANGE OUTPUT DRIVER CIRCUIT FOR SEMICONDUCTOR DEVICE

(71) Applicant: Integrated Silicon Solution, (Cayman) Inc., Grand Caymans (KY)

(72) Inventor: Kyoung Chon Jin, Danville, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/704,620

(22) Filed: Dec. 5, 2019

(51) Int. Cl.
    *H03K 17/68* (2006.01)
    *H03K 17/687* (2006.01)
    *H03K 3/037* (2006.01)

(52) U.S. Cl.
    CPC ......... *H03K 17/6872* (2013.01); *H03K 3/037* (2013.01)

(58) Field of Classification Search
    None
    See application file for complete search history.

(56) References Cited

U.S. PATENT DOCUMENTS

| | | | | |
|---|---|---|---|---|
| 7,183,817 B2* | 2/2007 | Sanchez | ........... | H03K 19/00315 327/112 |
| 8,446,173 B1* | 5/2013 | Faucher | ......... | H03K 19/017509 326/86 |
| 8,791,722 B2* | 7/2014 | Lee | ................... | H03K 19/00315 327/108 |
| 9,876,489 B1* | 1/2018 | Casey | ....................... | H03K 5/06 |
| 9,948,291 B1* | 4/2018 | Weigand | .............. | H03K 17/567 |
| 2006/0181322 A1* | 8/2006 | Kim | .................... | H03K 19/0013 327/206 |
| 2010/0176848 A1* | 7/2010 | Du | ........................ | G11C 7/1057 327/108 |
| 2012/0182076 A1* | 7/2012 | Kim | ....................... | H03L 7/0998 331/15 |
| 2014/0266320 A1* | 9/2014 | Conrow | ......... | H03K 19/018592 327/108 |
| 2017/0047927 A1* | 2/2017 | Liu | ................... | H03K 3/356182 |
| 2017/0264288 A1* | 9/2017 | Wu | ..................... | H03K 17/6872 |

* cited by examiner

*Primary Examiner* — Lincoln D Donovan
*Assistant Examiner* — Khareem E Almo
(74) *Attorney, Agent, or Firm* — Carmen C. Cook

(57) ABSTRACT

An output circuit receives a data signal biased within a first voltage range associated with a first power supply voltage and generates an output signal on an output node biased within a second voltage range in response to the data signal, the second voltage range is associated with a second power supply voltage greater than the first power supply voltage. The output circuit generates pull-up and pull-down signals that are within the first voltage range in response to the data signal. The output circuit includes an output driver circuit including a pull-up circuit and a pull-down circuit. The pull-up circuit, when activated, generates the output signal indicative of the second power supply voltage in response to a modified pull-up signal being the pull-up signal level-shifted to a third voltage range. The pull-down circuit, when activated, generates the output signal being the ground potential in response to the pull-down signal.

20 Claims, 12 Drawing Sheets

| OUT_EN | DATA | PUb | PD | PMOS Pull-Up | NMOS Pull-down | OUT |
|---|---|---|---|---|---|---|
| 0 | 0 | 1 | 0 | Pull-up Off | Pull-down Off | 0 |
| 0 | 1 | 1 | 0 | Pull-up Off | Pull-down Off | 0 |
| 1 | 0 | 1 | 1 | Pull-up Off | Pull-down On | 0 |
| 1 | 1 | 0 | 0 | Pull-up On | Pull-down Off | 1 |

| DATA | PUb | PD | Pull-Up | Pull-down | PBIAS | NBIAS | MPUb | PD | Output Pad |
|---|---|---|---|---|---|---|---|---|---|
| 0 | 1 (VDDI) | 1 (VDDI) | Off | On | EVDD-ΔV | DC Bias | EVDD | VDDI | 0V |
| 1 | 0 (0V) | 0 (0V) | On | Off | EVDD-ΔV | DC Bias | PBIAS | 0V | EVDD |

FIG. 8

WIDE RANGE OUTPUT DRIVER CIRCUIT FOR SEMICONDUCTOR DEVICE

FIELD OF THE INVENTION

The invention relates generally to integrated circuits, and, in particular, to an output driver circuit in an integrated circuit capable of operating over a wide voltage range.

BACKGROUND OF THE INVENTION

CMOS integrated circuits include an output circuit connected to an output pad of the integrated circuit to provide an output signal on the output pad. The output circuit may include logic circuits for generating control signals and also an output driver circuit. The output driver circuit typically includes one P-channel device and one N-channel device stacked in series between the power supply voltage and ground. In one example, non-volatile memory devices, such as flash memory devices, include output circuits to provide read data onto output pads.

In some applications, integrated circuits such as flash memory devices down-convert an external power supply voltage provided to the integrated circuit to a lower voltage for internal power regulation in order to reduce power consumption. For instance, a voltage down converter may be used to generate an internal power supply voltage from the external power supply voltage. Besides reducing power consumption, using the voltage down converter also stabilizes the internal power and enables circuit design using low voltage transistors. For example, the integrated circuit may be designed for 3V operation (that is, the external power supply is 3V) using 3V transistors. By using voltage down conversion, the internal circuitry can be constructed using low voltage transistors, that is, transistors operating below 3V, such as 1.8V transistors. However, the output driver circuit still needs to use the high voltage transistors. For example, for external power supply in the range of 2.5V to 3.6V, the output driver is implemented using 5V transistors.

FIG. 1 is a circuit diagram of a conventional output circuit in some examples. Referring to FIG. 1, an output circuit 1 includes an output buffer 5 and an output driver 10. The output buffer 5 receives the output enable signal OUT_EN (node 24) and the output data signal DATA (node 26) and includes logic circuitry to generate the pull-up signal PUb and the pull-down signal PD. For example, the output buffer 5 includes an NAND gate 16, an inverter 17 and an NOR gate 18 to generate the pull-up and pull-down signals PUb and PD. The output driver 10 includes a PMOS transistor M1 and an NMOS transistor M2 connected in series between the power supply voltage and the ground potential. The common node 28 between the two transistors M1 and M2 is connected to the output pad. In operation, in response to the output data signal DATA, either the pull-up signal PUb activates the PMOS transistor M1 or the pull-down signal PD activates the NMOS transistor M2. The PMOS transistor M1, when activated, pulls the output node 28 to the power supply voltage, thereby generating an output signal having a logical high state. The NMOS transistor M2, when activated, pulls the output node 28 to the ground voltage, thereby generating the output signal having a logical low state.

The output circuit 1 is formed as part of an integrated circuit being supplied by an external power supply voltage, referred to as external Vdd or EVDD (node 14). For example, the external Vdd may be 2.5V to 3.6V. The external Vdd is down-converted to an internal power supply voltage, referred to as internal Vdd or VDDI (node 12). The internal power supply voltage may be 2V. Accordingly, the output enable signal OUT_EN and the output data signal DATA are both internal signals and are biased to the internal Vdd voltage range (e.g. 2V). The output buffer 5 is constructed using low voltage transistors for operating in the internal Vdd voltage range. The pull-up signal PUb and the pull-down signal PD are therefore also biased to the internal Vdd voltage range. However, the output driver 10, interfacing with circuitry external to the integrated circuit, must operate within the external Vdd voltage range. Therefore, the output driver 10 is constructed using high voltage transistors M1 and M2 capable of being operated in the external Vdd voltage range. Level shifters 20 and 22 are used to level shift the pull-up signal PUb and the pull-down signal PD to the appropriate level for driving the transistors M1 and M2 in the output driver 10.

Using high voltage transistors in the output driver circuit make the output speed slower due to the high threshold voltage (Vt), low drain current Idsat and lower transconductance of the high voltage transistor. Furthermore, a larger transistor size is needed for the high voltage transistors, increasing the layout area required for the output driver circuit. As the demand for high speed devices grows, the need for faster read speed in integrated circuit increase. The output driver is a critical component of read speed parameter in integrated circuit designs, especially memory design.

BRIEF DESCRIPTION OF THE DRAWINGS

Various embodiments of the invention are disclosed in the following detailed description and the accompanying drawings.

FIG. 8 is a table illustrating the operating conditions of the output circuit of FIG. 2 in some embodiments.

DETAILED DESCRIPTION

Figure 1:
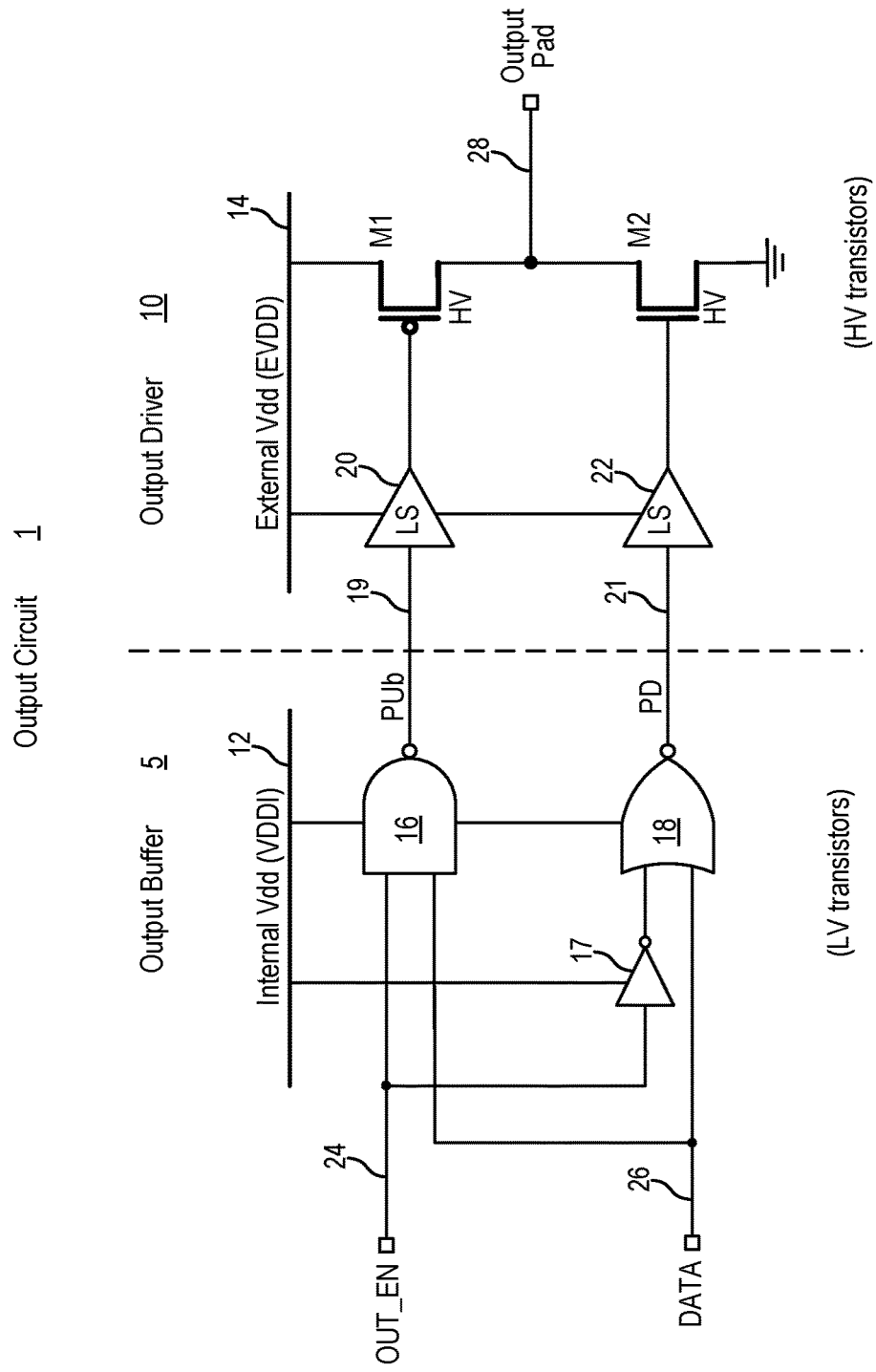
FIG. 1 is a circuit diagram of a conventional output circuit in some examples.

According to embodiments of the present disclosure, an output circuit receives a data signal biased within a first voltage range associated with a first power supply voltage and generates an output signal biased within a second voltage range in response to the data signal, the second voltage range is associated with a second power supply voltage greater than the first power supply voltage. The output circuit includes an output buffer circuit generating pull-up and pull-down signals that are within the first voltage range. The output circuit further includes an output driver circuit including a pull-up circuit and a pull-down circuit to generate the output signal within the second voltage range. The pull-up circuit, when activated, generates the output signal having a voltage value indicative of the second power supply voltage in response to a modified pull-up signal being the pull-up signal level-shifted to a third voltage range. The pull-down circuit, when activated, generates the output signal being the ground potential in response to the pull-down signal. In embodiments of the present disclosure, the output driver circuit includes only low voltage transistors in the pull-up and pull-down circuits connected to the output pad. The output circuit realizes improved read speed by eliminating the use of high voltage transistors at the output pad.

In the present description, a low voltage (LV) transistor refers to transistors constructed using a thinner gate oxide and are designed to operate within a lower voltage range. For example, a low voltage transistor may be constructed with a gate oxide thickness of 45 Å for operation with a 2V power supply voltage. On the other hand, in the present description, a high voltage (HV) transistor refers to transistors constructed using a thicker gate oxide and are designed to operate within a higher voltage range. For example, a high voltage transistor may be constructed with a gate oxide thickness of 160 Å for operation with a 3-5V power supply voltage.

In embodiments of the present description, the output circuit is formed as part of an integrated circuit to provide an output signal on an output pad of the integrated circuit. The integrated circuit is supplied by a power supply voltage external to the integrated circuit—referred to as the external power supply voltage or external Vdd (EVDD). Accordingly, the output circuit provides the output signal biased to the external Vdd voltage range. Meanwhile, the integrated circuit may down-convert the external Vdd voltage to a lower voltage to use as the internal power supply voltage— referred to as the internal power supply voltage or internal Vdd (VDDI). In one example, the external Vdd voltage is 3.6V and the internal Vdd voltage is 2V. The internal Vdd is used to power the internal circuitry of the integrated circuit.

In the conventional output circuit, the output driver is constructed using high voltage transistors (e.g. 5V transistors) capable of operating within the external power supply voltage range while the output buffer and other internal circuitry is constructed using low voltage transistors (e.g. 2V transistors) capable of operating within the internal power supply voltage range only. In embodiments of the present disclosure, the output circuit includes an output driver circuit constructed using low voltage transistors (e.g. 2V transistors) capable of operating within the internal power supply voltage range only to generate the output signal being biased within the external power supply voltage range. That is, the transistors connected to the output pad are low voltage transistors (e.g. 2V transistors), even though the output signal are biased to the external power supply voltage range (e.g. 3.6V EVDD).

In one embodiment of the present disclosure, the output circuit is supplied by an external Vdd of 3.6V and the output driver circuit is constructed using 1.8V low voltage transistors or thin gate oxide transistors with a gate oxide thickness of 45 Å. For the purpose of comparison, a high voltage transistor refers to a 5V transistor or a thick gate oxide transistor with a gate oxide thickness of 160 Å. The output driver circuit of the present disclosure does not include any high voltage transistors connected to the output node. The output circuit of the present disclosure generates bias voltages to drive the output driver circuit so that the low voltage transistors are protected from any damage even when being operated to produce the output signal in the external voltage range.

Figures 2, 2A:
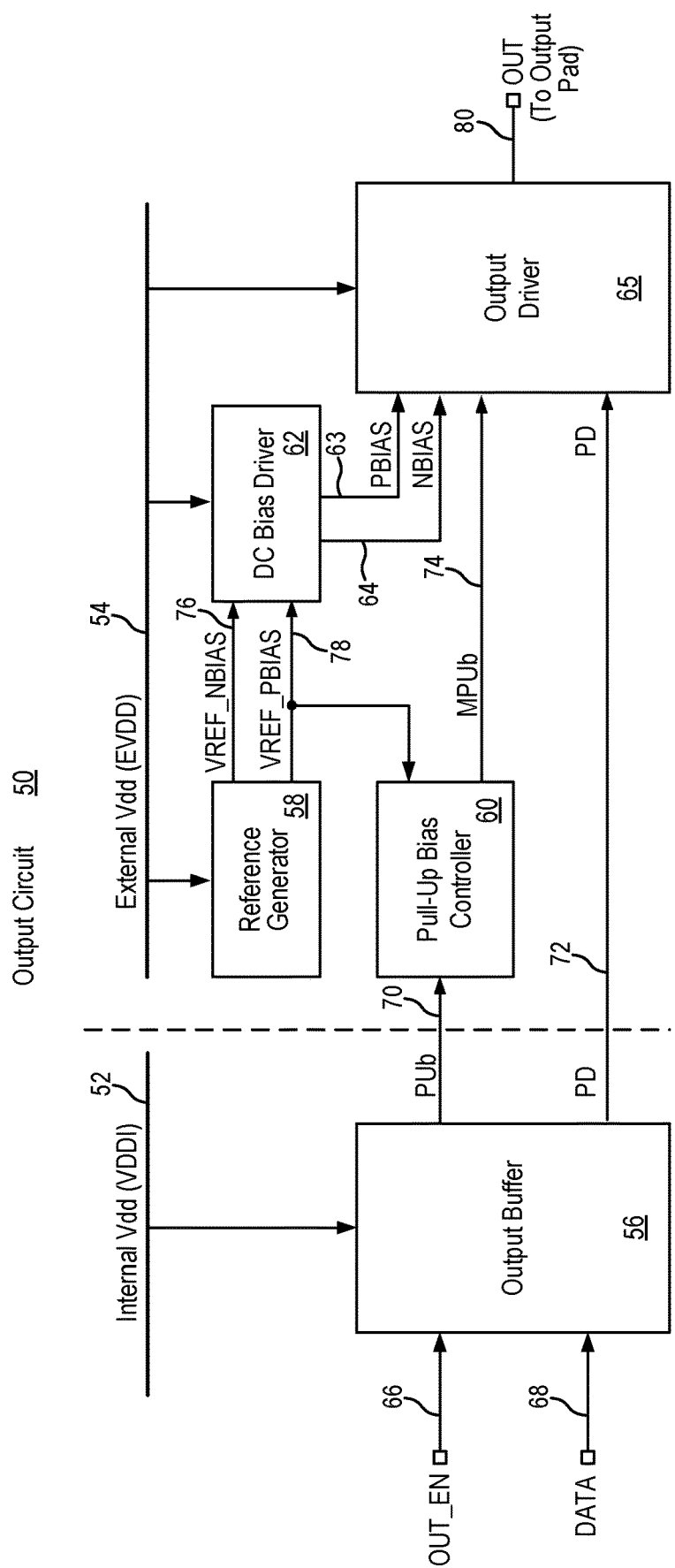
FIG. 2, which includes
FIG. 2a, is a schematic diagram of an output circuit in embodiments of the present disclosure.

FIG. 2, which includes FIG. 2a, is a schematic diagram of an output circuit in embodiments of the present disclosure. Referring to FIG. 2, an output circuit 50 includes an output buffer 56 and an output driver circuit 65. The output driver circuit includes a pull-up circuit and a pull-down circuit connected to the output node to provide the output signal. The output circuit 50 further includes a pull-up bias controller 60, a reference generator 58 and a DC bias driver 62 for generating the bias voltages for driving the output driver circuit 65. The output circuit 50 is formed as part of an integrated circuit being supplied by an external power supply voltage, referred to as external Vdd or EVDD (node 54). For example, the external Vdd may be 2.5V to 3.6V. The external Vdd is down-converted to an internal power supply voltage, referred to as internal Vdd or VDDI (node 52). The internal power supply voltage may be 2V. The output driver circuit 65 and the related bias voltage generating circuitry are powered by the external Vdd (e.g. 3.6V) while the output buffer 56 of the output circuit and/or other internet circuitry of the integrated circuit are powered by the internal Vdd (e.g. 2V).

The output circuit 50 receives an output enable signal OUT_EN (node 66) and an output data signal DATA (68). The output enable signal OUT_EN and the output data signal DATA are both internal signals and are biased to the internal Vdd voltage range. The output enable signal OUT_EN determines whether the output circuit 50 is activated (enabled) and providing output signal or deactivated (disabled) and not providing any output signal. FIG. 2a is a truth table illustrating the operational states of the output circuit 50. In particular, FIG. 2a illustrates the logical states of the signals in the output circuit 50.

The output buffer 56 receives the output enable signal OUT_EN (node 66) and the output data signal DATA (node 68) and includes logic circuitry to generate the pull-up signal PUb (node 70) and the pull-down signal PD (node 72). The pull-up signal PUb has a first logical state (e.g. logical high or "1") to deactivate or turn off the pull-up circuit of the output driver circuit 65 and a second logical state (e.g. logical low or "0") to activate or turn on the pull-up circuit of the output driver circuit 65. The pull-down signal PD has a first logical state (e.g. logical low or "0") to deactivate or turn off the pull-down circuit of the output driver circuit 65 and a second logical state (e.g. logical high or "1") to activate or turn on the pull-down circuit of the output driver circuit 65. FIG. 2a summarizes the states of the pull-up signal and the pull-down signal and the associated operational states of the pull-up circuit and the pull-down circuit.

The output buffer 56 is coupled to the internal Vdd and is constructed using all low voltage transistors or transistors that operates within the internal Vdd voltage range. For example, when the internal Vdd is 2V, the output buffer 56 may be constructed using 1.8V transistors. As thus configured, the output buffer 56 generates the pull-up signal PUb and the pull-down signal PD both biased to the internal Vdd voltage range. The output buffer 56 can be implemented in various ways to implement the logical relationship of the input signals (OUT_EN and DATA) and output signals (PUb and PD) based on the truth table shown in FIG. 2a.

Figure 3:
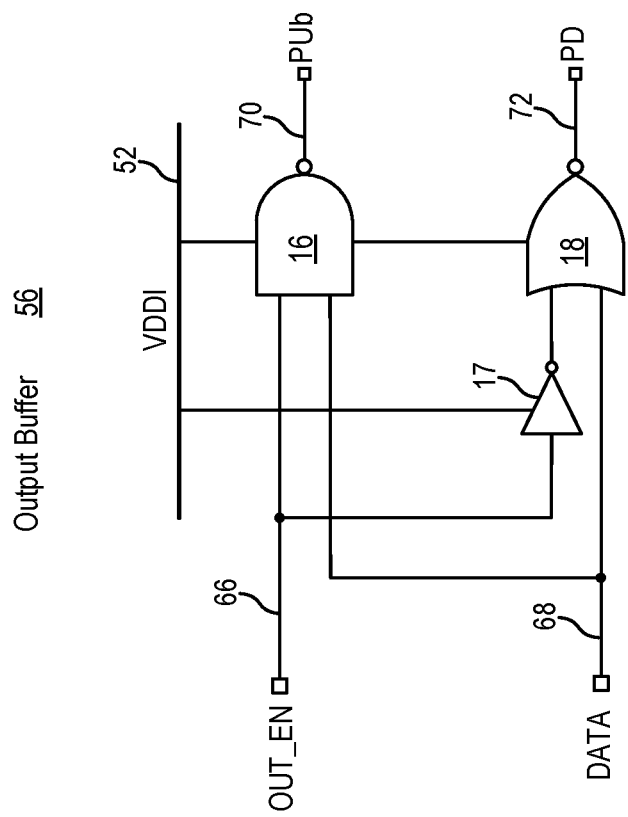
FIG. 3 is a circuit diagram illustrating an output buffer circuit in some embodiments.

FIG. 3 is a circuit diagram illustrating an output buffer circuit in some embodiments. The output buffer circuit in FIG. 3 can be used to implement the output buffer 56 in the output circuit 50 of FIG. 2. Referring to FIG. 3, the output buffer 56 includes an NAND gate 16 receiving the output enable signal OUT_EN (node 66) and the output data signal DATA (node 68) as inputs. The NAND gate 16 generates the pull-up signal PUb as output on node 70. The output buffer 56 also includes an inverter 17 providing an inverted output enable signal and an NOR gate 18 receiving the inverted output enable signal and the output data signal DATA (node 68) as inputs. The NOR gate 18 generates the pull-down signal PD as output on node 72. In one example, the internal Vdd is 2V. The output enable signal OUT_EN and the output data signal DATA have a voltage swing of 0 to 2V. The pull-up signal PUb and the pull-down signal PD also have a voltage swing of 0 to 2V.

Returning to FIG. 2, the output driver circuit 65 includes the pull-up circuit to pull-up or drive the output node 80 to the external Vdd voltage as the output signal OUT. The output driver circuit 65 includes the pull-down circuit to pull-down or drive the output node 80 to the ground potential as the output signal OUT. A salient feature of the output circuit of the present disclosure is that the output driver circuit 65 includes only low voltage transistors, even though the output signal OUT has a voltage swing associated with the external Vdd voltage. That is, the transistors connected to the output node 80 are low voltage transistors designed to operate in the internal Vdd voltage range while the output signal OUT is biased in the external Vdd voltage range. In one example, the output driver circuit 65 is constructed using the same low voltage transistors used in the output buffer of the output circuit 50. For example, the output driver circuit 65 can be constructed using 1.8V transistors while the external Vdd voltage is 3.6V and the output signal OUT has a voltage swing of 0 to 3.6V. The output circuit 50 includes bias voltage generating circuitry to generate biased voltage signals to drive the output driver circuit 65 so as to protect the low voltage transistors from damage while being operated under the higher external power supply voltage. Using low voltage transistors in the output driver circuit realizes particular advantages in maximizing the output driving capability while reducing the layout area for the output driver circuit.

Figure 4:
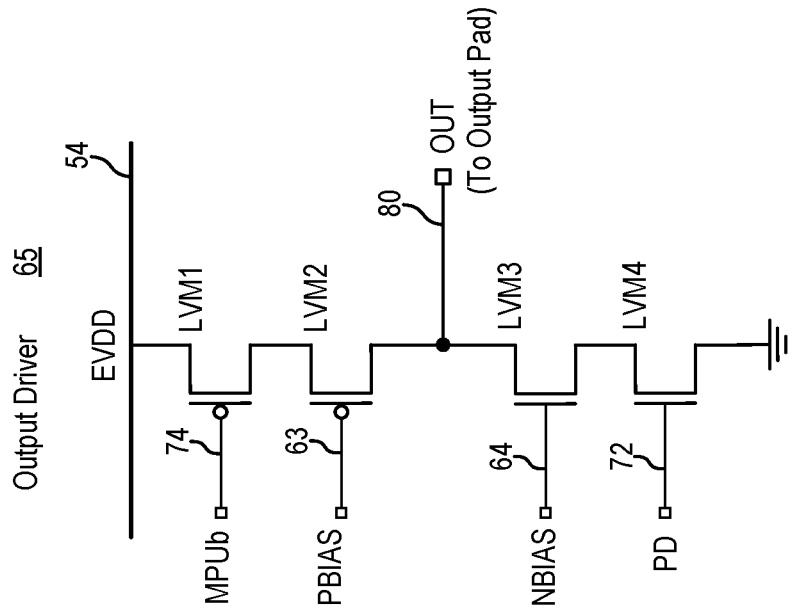
FIG. 4 is a transistor level diagram of an output driver circuit in some embodiments.

FIG. 4 is a transistor level diagram of an output driver circuit in some embodiments. The output driver circuit in FIG. 4 can be used to implement the output driver circuit 65 in the output circuit 50 of FIG. 2. Referring to FIG. 4, the output driver circuit 65 includes a PMOS transistor LVM1 and a PMOS transistor LVM2 connected in series between the external power supply voltage EVDD and the output node 80. The PMOS transistors M1 and M2 form the pull-up circuit of the output driver circuit 65. The output driver circuit 65 further includes an NMOS transistor M3 and an NMOS transistor M4 connected in series between the output node 80 and the ground potential. The NMOS transistors M3 and M4 form the pull-down circuit of the output driver circuit 65. Transistors M1, M2, M3 and M4 are all low voltage transistors. That is, the transistors M1-M4 are not designed to operate within the external power supply voltage range. For example, transistors M1, M2, M3 and M4 are 1.8V transistors when the external Vdd is 3.6V. The output driver circuit 65 generates the output signal OUT having voltage switch between the ground potential and the external Vdd voltage. For example, the output signal OUT has a voltage swing between 0 and 3.6V.

The output driver circuit 65 are driven by bias voltage signals generated by bias voltage generating circuitry in the output circuit to drive the output node 80 high (EVDD) or low (ground) in response to the output data signal. In embodiments of the present disclosure, the gate voltages applied to the transistors M1, M2, M3 and M4 are selected in a manner to protect the low voltage transistors during operation under the external Vdd voltage range. In particular, the transistors M1, M2, M3 and M4 biased in such a way as to allow the low voltage transistors to endure the external Vdd, thereby enlarging the operation range of the transistors.

More specifically, the pull-up circuit of the output driver circuit 65 receives a modified pull-up signal MPUb coupled to the gate terminal or control terminal (node 74) of the PMOS transistor M1 and a bias voltage PBIAS coupled to the gate (or control) terminal (node 63) of the PMOS transistor M2. The modified pull-up signal MPUb is a level-shifted version of the pull-up signal PUb. In particular, the modified pull-up signal MPUb has the same logical state as the pull-up signal PUb but with level shifted voltage levels. The pull-up signal PUb has a voltage swing between 0V and VDDI (e.g. 0 to 2V). The modified pull-up signal MPUb has a voltage swing between the bias voltage PBIAS and the EVDD (e.g. 2V to 3.6V). Furthermore, the bias voltage PBIAS is a voltage less than and proportional to the external power supply voltage. The bias voltage PBIAS is therefore a function of the EVDD voltage and varies with the EVDD voltage. That is, PBIAS=EVDD-ΔV. In some embodiments, the voltage ΔV is selected based on the EVDD voltage and the voltage tolerance of the low voltage transistors to be protected. For example, the voltage ΔV can have a voltage value related to the gate-to-source voltage Vgs of the PMOS transistor M1/M2. The bias voltage PBIAS is used to bias PMOS transistor M2 so as to step down the gate-to-source voltage that would be applied across the PMOS transistor M1. For example, the bias voltage PBIAS is set to 1.6V less than EVDD. When the EVDD voltage is 3.6V, the bias voltage PBIAS is 2V and the modified pull-up signal MPUb has a voltage swing between 2V and 3.6V. In this manner, low voltage transistors M1 and M2 can be operated between the external power supply voltage range.

Meanwhile, the pull-down circuit of the output driver 65 receives a bias voltage NBIAS coupled to the gate or control terminal (node 64) of the NMOS transistor M3 and the pull-down signal PD coupled to the gate or control terminal (node 72) of the NMOS transistor M4. The bias voltage NBIAS is has a fixed voltage value less than the external Vdd voltage value. That is, the bias voltage NBIAS is not a function of the EVDD voltage and dose not vary with the EVDD voltage. The bias voltage NBIAS is used to biased NMOS transistor M3 so as to step down the gate-to-source voltage that would be applied across the NMOS transistor M4. For example, the bias voltage NBIAS is set to 2V. When the EVDD voltage is 3.6V and the VDDI voltage is 2V, the bias voltage NBIAS is 2V and the pull-down signal PD has a voltage swing between 0V and 2V. In this manner, low voltage transistors M3 and M4 can be operated between the external power supply voltage range.

The operation of the output driver circuit 65 will be described assuming the output enable signal OUT_EN is enabled (logical state "1"). In operation, in response to the output data signal DATA having the logical low state ("0"), the pull-up signal PUb has a logical high value and the modified pull-up signal MPUb also has a logical high value. That is, the modified pull-up signal MPUb has a voltage value of EVDD which is applied to the gate terminal (node 74) of the PMOS transistor M1. Transistor M1 is therefore turned off or deactivated. The pull-up circuit in the output driver circuit 65 is turned off. Meanwhile, the pull-down signal PD has a logical high value. The pull-down signal PD has a voltage value of VDDI which is applied to the gate terminal (72) of the NMOS transistor M4. Transistor M4 is turned on or activated. Transistor M3, biased by the bias voltage NBIAS, is also turned on. The pull-down circuit in the output driver circuit 65 is therefore turned on to drive the output signal OUT to the ground potential. In the case the output node was previously biased to the EVDD voltage, the EVDD voltage is distributed across the NMOS transistors M3 and M4. NMOS transistors M3 and M4 are protected from damage while driving the output node to the ground voltage in response to the DATA signal having the logical low state.

On the other hand, in response to the output data signal DATA having the logical high state ("1"), the pull-down signal PD has a logical low value or ground voltage which is applied to the gate terminal (node 72) of the NMOS transistor M4. Transistor M4 is therefore turned off or deactivated. The pull-down circuit in the output driver circuit 65 is turned off. Meanwhile, the pull-up signal PUb has a logical low value and the modified pull-up signal MPUb also has a logical low value. That is, the modified pull-up signal MPUb has a voltage value of PBIAS which is applied to the gate terminal (node 74) of the PMOS transistor M1. Transistor M1 is therefore turned on or activated. Transistor M2, biased by the bias voltage PBIAS, is also turned on. The pull-up circuit in the output driver circuit 65 is turned on or activated to drive the output signal OUT to the EVDD voltage. In the case the output node was previously biased to the ground voltage, the EVDD voltage difference is distributed across the PMOS transistors M1 and M2. PMOS transistors M1 and M2 are protected from damage while driving the output node to the EVDD voltage in response to the DATA signal having the logical high state.

As thus configured, PMOS transistor M2, biased by the bias voltage PBIAS, is kept on to protect PMOS transistor M1 so that transistor M1, when activated by the modified pull-up signal MPUb, does not go to the ground voltage when the output signal OUT was previously grounded. Transistor M2 keeps the gate-to-source voltage across transistor M1 to a voltage within the limit of the transistor (e.g. less than 2V). When activated by the modified pull-up signal MPUb, the EVDD voltage is divided across transistors M1 and M2 so that the low voltage transistors are protected. Similarly, the NMOS transistor M3, biased by the bias voltage NBIAS, is kept on to protect the NMOS transistor M4 so that transistor M4, when activated by the pull-down signal PD, does not go to the EVDD voltage when the output signal OUT was previously driven high. Transistor M3 keeps the gate-to-source voltage across transistor M4 to a voltage within the limit of the transistor (e.g. less than 2V). When activated by the pull-down signal PD, the EVDD voltage is divided across transistors M3 and M4 so that the low voltage transistors are protected.

Returning to FIG. 2, the output circuit 50 includes bias voltage generating circuitry to generate the bias voltages and the modified pull-up signal for driving the output driver circuit 65. In embodiments of the present invention, the output circuit 50 includes a reference generator 58 for generating a first reference voltage VREF_NBIAS (node 76) and a second reference voltage VREF_PBIAS (node 78). For example, the reference generator 58 may be constructed as a bandgap reference circuit or a constant bias voltage source. In some embodiments, the reference generator 58 generates the first reference voltage VREF_NBIAS being a fixed reference voltage less than the EVDD voltage and generates the second reference voltage VREF_PBIAS being a reference voltage proportional to the EVDD voltage.

Figure 5:
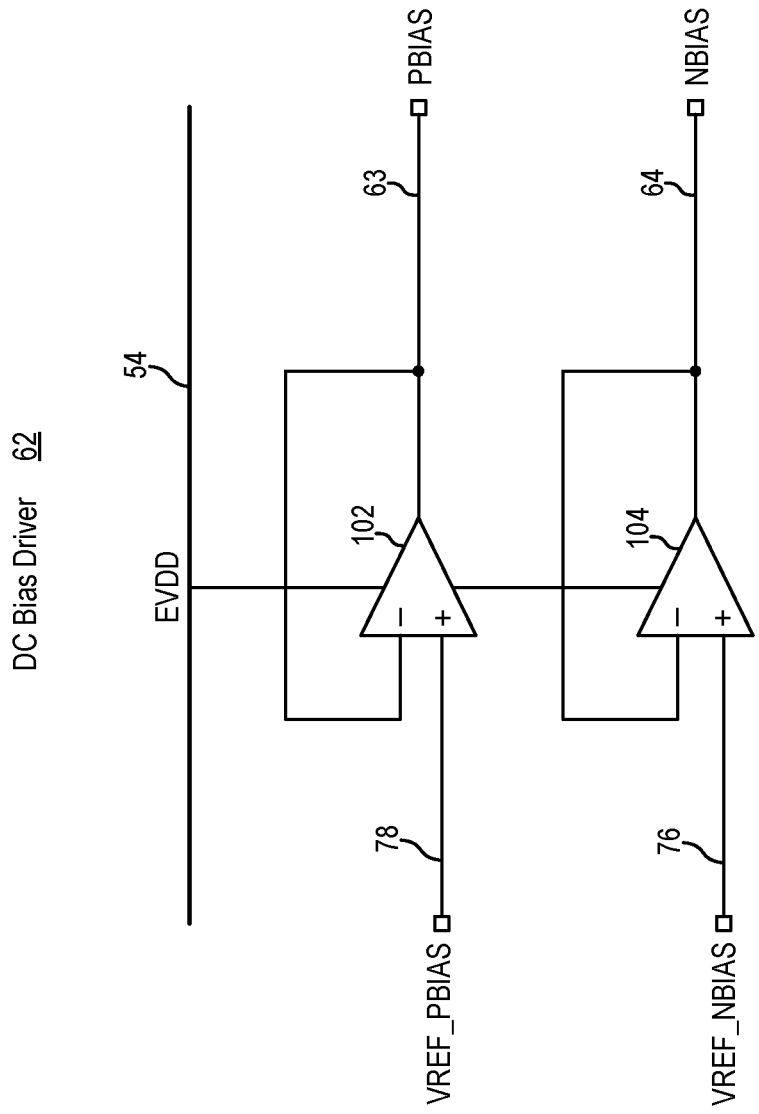
FIG. 5 is a circuit diagram of a DC bias driver circuit in some embodiments.

The first and second reference voltages VREF_NBIAS and VREF_PBIAS are provided to a DC bias driver circuit 62 to generate the bias voltage NBIAS (node 64) and the bias voltage PBIAS (node 63). In some embodiments, the DC bias driver circuit 62 is provided to buffer the reference voltages. Thus, the bias voltages have the same voltage values as the reference voltages. That is, the first bias voltage NBIAS is the same as the first reference voltage VREF_NBIAS and the second bias voltage PBIAS is the same as the second reference voltage VREF_PBIAS. FIG. 5 is a circuit diagram of a DC bias driver circuit in some embodiments. Referring to FIG. 5, a DC bias driver circuit 62 includes a first amplifier 102 receiving the second reference voltages VREF_PBIAS and configured in a feedback loop to generate the second bias voltage PBIAS. The DC bias driver circuit 62 further includes a second amplifier 104 receiving the first reference voltages VREF_NBIAS and configured in a feedback loop to generate the first bias voltage NBIAS. The first and second bias voltages NBIAS and PBIAS are then used to drive the gate terminals of respective NMOS transistor M3 and PMOS transistor M2 of the output driver circuit to provide the appropriate bias levels to protect the low voltage transistors operating in the external Vdd voltage. The DC bias driver circuit in FIG. 5 is illustrative only and not intended to be limiting. In actual implementation, the reference generator 58 and the DC bias driver circuit 62 can be combined as a single circuit to generate the bias voltages NBIAS and PBIAS.

Returning to FIG. 2, the output circuit 50 further includes a pull-up bias controller 60. The pull-up bias controller 60 receives the pull-up signal Pub (node 70) and the second reference voltage VREF_PBIAS (node 78) and generates the modified pull-up signal MPUb (node 74). In the present embodiment, the pull-up bias controller 60 receives the second reference voltage VREF_PBIAS from the reference generator 58. In other embodiments, the pull-up bias controller 60 can be configured to receive the second bias voltage PBIAS from the DC bias driver 62. The second bias voltage PBIAS has the same voltage value as the second reference voltage VREF_PBIAS and the two bias voltages can be used interchangeably.

Figures 6, 6A:
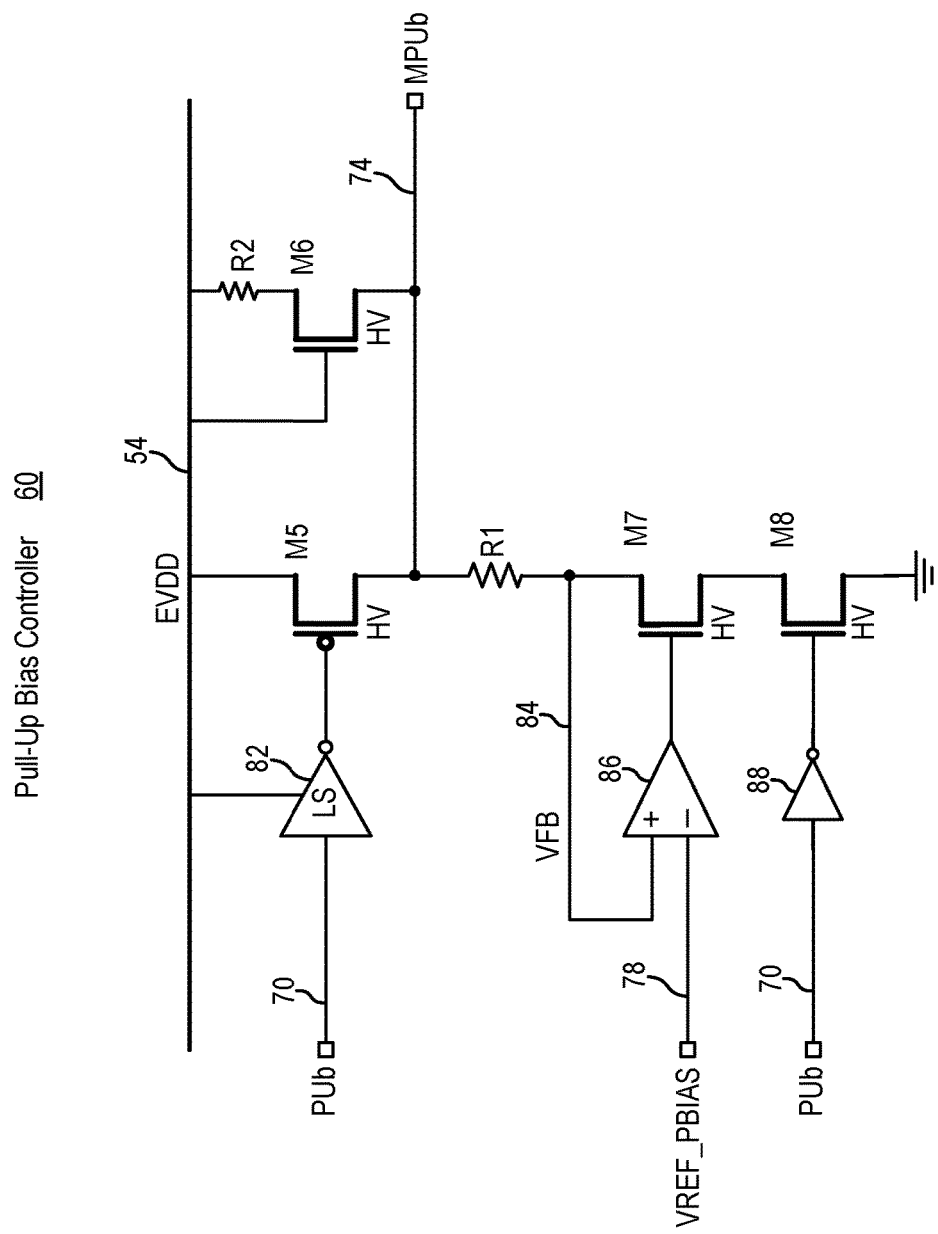
FIG. 6, which includes
FIG. 6a, is a circuit diagram of a pull-up bias controller in some embodiments.

FIG. 6, which includes FIG. 6a, is a circuit diagram of a pull-up bias controller in some embodiments. The pull-up bias controller in FIG. 6 can be used to implement the pull-up bias controller 60 in the output circuit 50 of FIG. 2. Referring to FIG. 6, the pull-up bias controller 60 receives the pull-up signal PUb (node 70) and the second reference voltage VREF_PBIAS (node 78) and generates the modified pull-up signal MPUb (node 74). In particular, the pull-up signal PUb is biased within the voltage range of the internal Vdd (or VDDI). The modified pull-up signal MPUb has the same logical state as the pull-up signal PUb but shifted voltage levels. In some embodiments, the second reference voltage VREF_PBIAS (node 78) can be replaced by the second bias voltage PBIAS.

The pull-up bias controller 60 includes PMOS transistor M5 and NMOS transistors M6, M7 and M8, all being high voltage transistors. That is, transistors M5 to M8 are high voltage transistors or thick gate oxide transistors designed to operate within the external Vdd voltage range. It is instructive to note that because transistors M5 to M8 are not connected to the output node, these high voltage transistors do not impact the driving capability of the output driver at the output node of the output circuit.

In pull-up bias controller 60, the pull-up signal PUb is coupled to an inverting level shifter 82 referenced to the EVDD voltage and the level-shifted and inverted pull-up signal is coupled to the gate terminal of the PMOS transistor M5. Transistor M5 is connected between the EVDD voltage and the output node 74 providing the modified pull-up signal MPUb. The NMOS transistor M6 is connected across the EVDD voltage and the output node 74, with a resistor R2 coupled between the drain terminal and the EVDD voltage. The gate terminal of the NMOS transistor M6 is connected to the EVDD voltage and the NMOS transistor M6 is therefore always biased on.

The pull-up bias controller 60 includes a resistor R1 connected to the output node 74 and a feedback node 84. The NMOS transistors M7 and M8 are connected in series between resistor R1 and the ground potential. The gate terminal of transistor M7 is driven by an error amplifier 86 configured in a feedback loop. Th error amplifier 86 has an inverting input terminal receiving the second reference voltage VREF_PBIAS (node 78) and an non-inverting input terminal coupled to the feedback node 84 to receive a feedback voltage VFB. As thus configured, when the current path is activated, transistor M7 is biased in a manner to drive the output node 74 to the second reference voltage VREF_PBIAS. The gate terminal of transistor M8 is driven by the inverse of the pull-up signal PUb.

As thus configured, and referring to FIG. 6a, in response to the pull-up signal PUb having a logical high state ("1") and a voltage level of the VDDI voltage, the pull-up circuit is to be turned off. In that case, the NMOS transistor M8 is turned off and the current path for transistor M7 is deactivated. The PMOS transistor M5 is turned on and drives the output node 74 to the EVDD voltage. The modified pull-up signal MPUb thus has a logical high value ("1") but at a voltage level of the EVDD voltage. On the other hand, in response to the pull-up signal PUb having a logical low state ("0") and a voltage level of the ground voltage, the pull-up circuit is to be turned on. In that case, the PMOS transistor M5 is turned off. The NMOS transistor M8 is turned on and a current path from NMOS transistor M6, through resistor R1, NMOS transistors M7 and M8 is formed to bias the output node 74 to the second reference voltage VREF_PBIAS (or the bias voltage PBIAS). As a result, the modified pull-up signal MPUb has a logical low value ("0") but at a voltage level of the PBIAS voltage.

As described above, the second reference voltage VREF_PBIAS or the second bias voltage PBIAS is equal to EVDD-$\Delta$V. Accordingly, the bias voltage PBIAS tracks the EVDD voltage and the logical low state of the modified pull-up signal MPUb has a voltage value that tracks the EVDD voltage.

Figure 7:
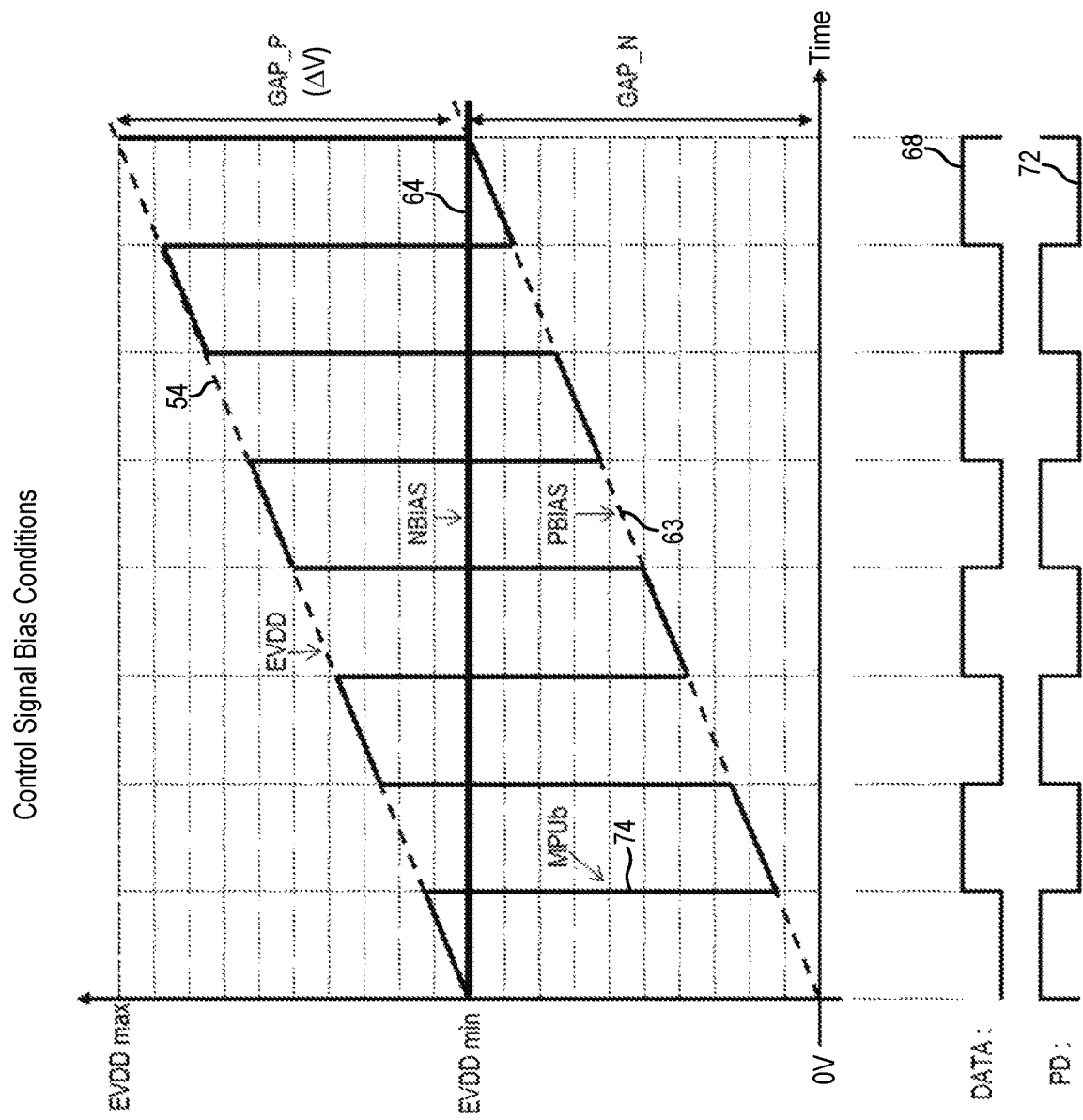
FIG. 7 is a plot illustrating the operation of the output circuit in some examples.

FIG. 7 is a plot illustrating the operation of the output circuit in some examples. Referring to FIG. 7, the output signal DATA (curve 68) and the pull-down signal PD (curve 72) are shown at the bottom of the plot. The bias voltage NBIAS (curve 64) is a fixed voltage level, which is selected to be the minimum EVDD voltage level. In one example, the bias voltage NBIAS is set at 2V. The bias voltage NBIAS is selected to provide a gap voltage GAP_N relative to the ground voltage for the low voltage NMOS transistors.

In the present illustration, the EVDD voltage (curve 54) is shown as varying from the minimum EVDD voltage value (EVDD min) to the maximum EVDD voltage value (EVDD max). The bias voltage PBIAS (curve 63) tracks the EVDD voltage and is lower by the $\Delta$V voltage (or gap voltage GAP_P). The EVDD voltage and the PBIAS voltage forms the upper and lower bounds for the modified pull-up signal MPUb (curve 74). The modified pull-up signal switches between the logical high and logical low states in response to the DATA signal but the voltage levels remain within the boundary set by PBIAS and EVDD voltages.

FIG. 8 is a table illustrating the operating conditions of the output circuit of FIG. 2 in some embodiments. Referring to FIG. 8, assuming the output enable signal OUT_EN is enabled, in response to the output data signal DATA having a logical low value ("0"), the pull-up signal PUb and the pull-down signal PD are both at a logical high value ("1") but at the internal Vdd voltage level (VDDI). The pull-up circuit is to be turned off and the pull-down circuit is to be turned on. The bias voltage PBIAS is set to EVDD-$\Delta$V and the bias voltage NBIAS is set to a fixed DC bias voltage value. The modified pull-up signal MPUb is at a logical high state with a voltage level of EVDD. The pull-down signal is at the voltage value of VDDI and the output signal OUT is driven to V.

In response to the output data signal DATA having a logical high value ("1"), the pull-up signal PUb and the pull-down signal PD are both at a logical low value ("0") and at the ground voltage. The pull-up circuit is to be turned on and the pull-down circuit is to be turned off. The bias voltage PBIAS is set to EVDD-$\Delta$V and the bias voltage NBIAS is set to a fixed DC bias voltage value. The modified pull-up signal MPUb is at a logical low state with a voltage level of the PBIAS voltage. The pull-down signal is at the ground voltage. As a result, the output signal OUT is driven to the EVDD voltage.

Figure 9:
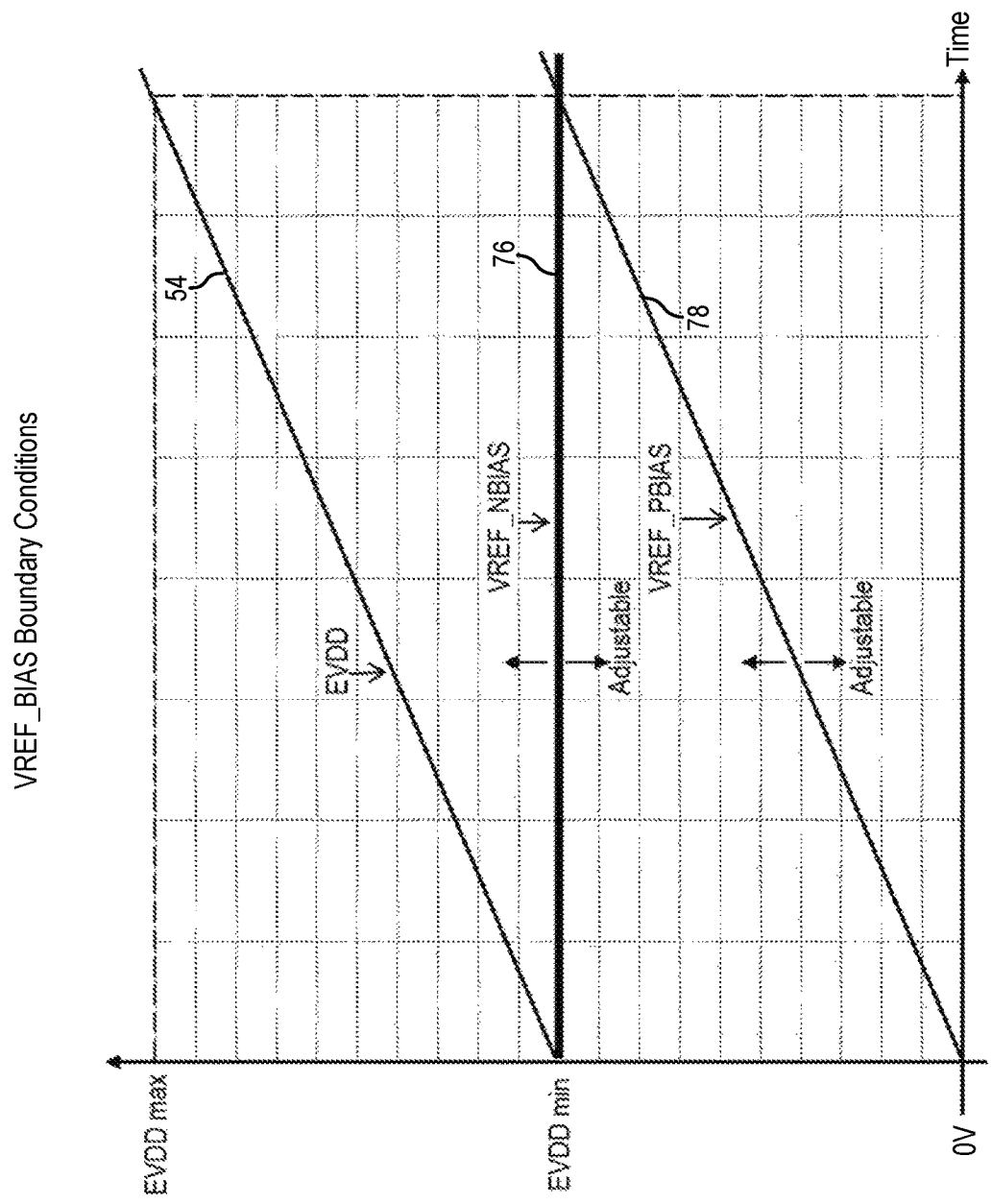
FIG. 9 is a plot illustrating the boundary conditions for the bias voltages in some embodiments.

FIG. 9 is a plot illustrating the boundary conditions for the bias voltages in some embodiments. Referring to FIG. 9, the reference voltage VREF_NBIAS (curve 76) is a fixed voltage and can be selected to have a voltage value between the threshold voltage of the low voltage NMOS transistor and the maximum gate to source voltage. That is:

LV NMOS Transistor Vt<VREF_NBIAS<max Vgs in EDR.

In the present embodiment, the bias voltage NBIAS has the same voltage value as reference voltage VREF_NBIAS. The bias voltage NBIAS applied to NMOS transistor M3 in the output driver circuit 65 thus has a voltage value higher than the threshold voltage of the transistor M3 but less than the maximum gate-to-source voltage of the transistor.

The reference voltage VREF_PBIAS (curve 78) is a voltage proportional to the EVDD voltage and can be selected to have a voltage value between the maximum gate to source voltage and the threshold voltage of the low voltage PMOS transistor. That is:

max Vgs in EDR<VREF_PBIAS<LV PMOS Transistor Vt.

In the present embodiment, the bias voltage PBIAS has the same voltage value as reference voltage VREF_PBIAS. The bias voltage PBIAS applied to PMOS transistor M2 in the output driver circuit 65 thus has an absolute voltage value greater than the threshold voltage of the transistor M2 but lower than the maximum gate-to-source voltage of the transistor.

Figure 10:
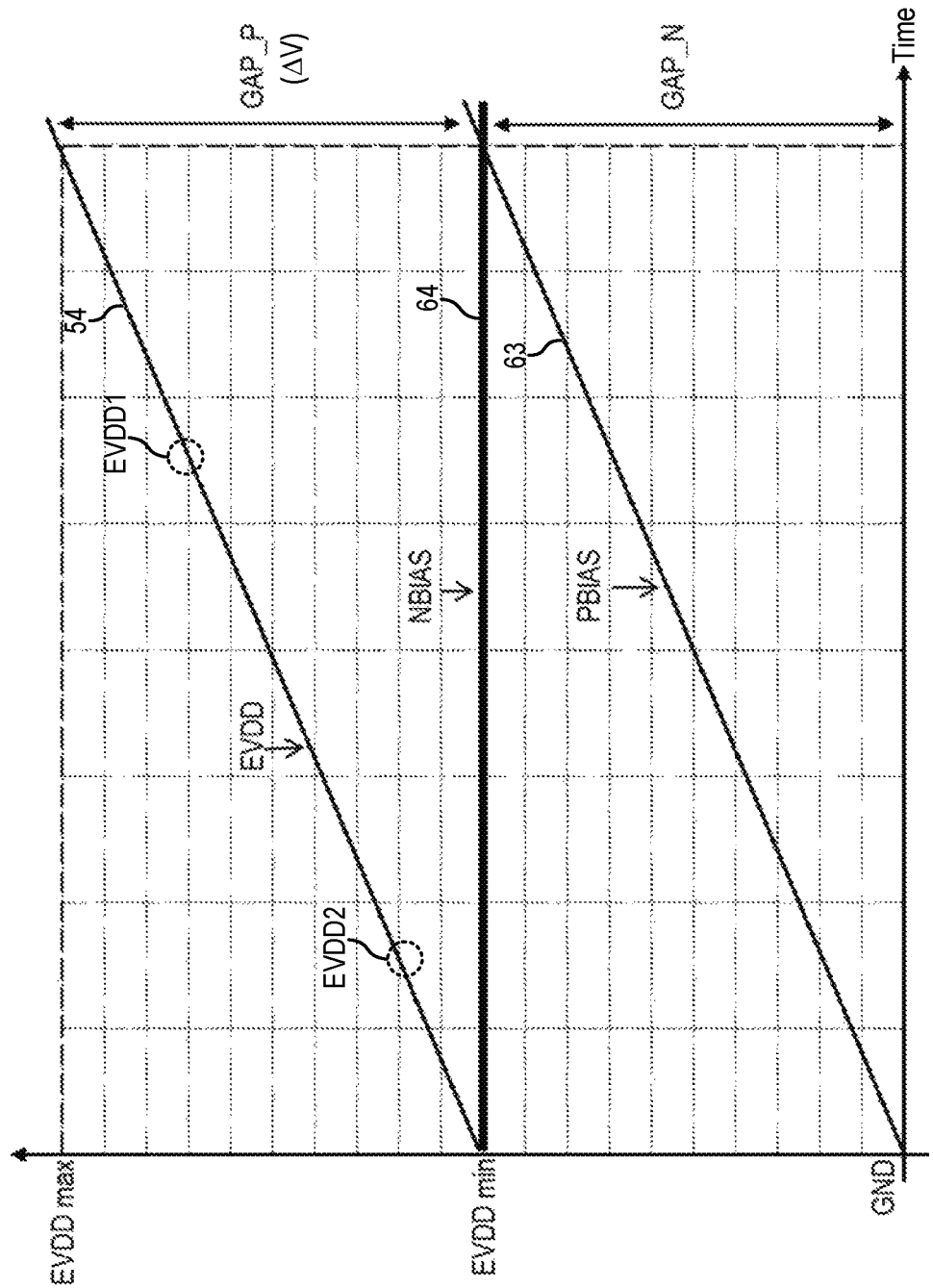
FIGS. 10-12 are plots illustrating operational examples of the output circuit of FIG. 2 in some embodiments.
Figure 11:
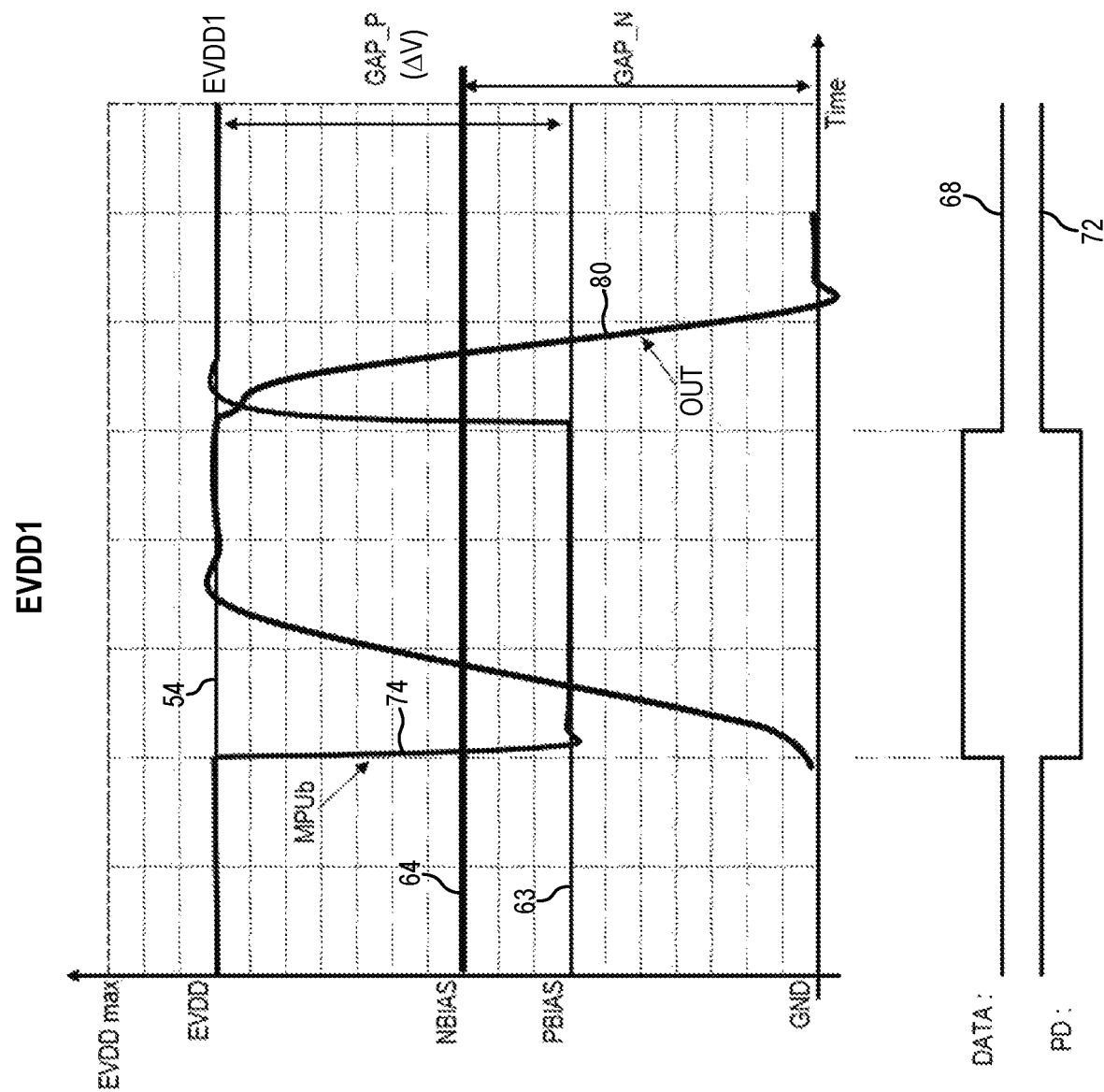
Figure 12:
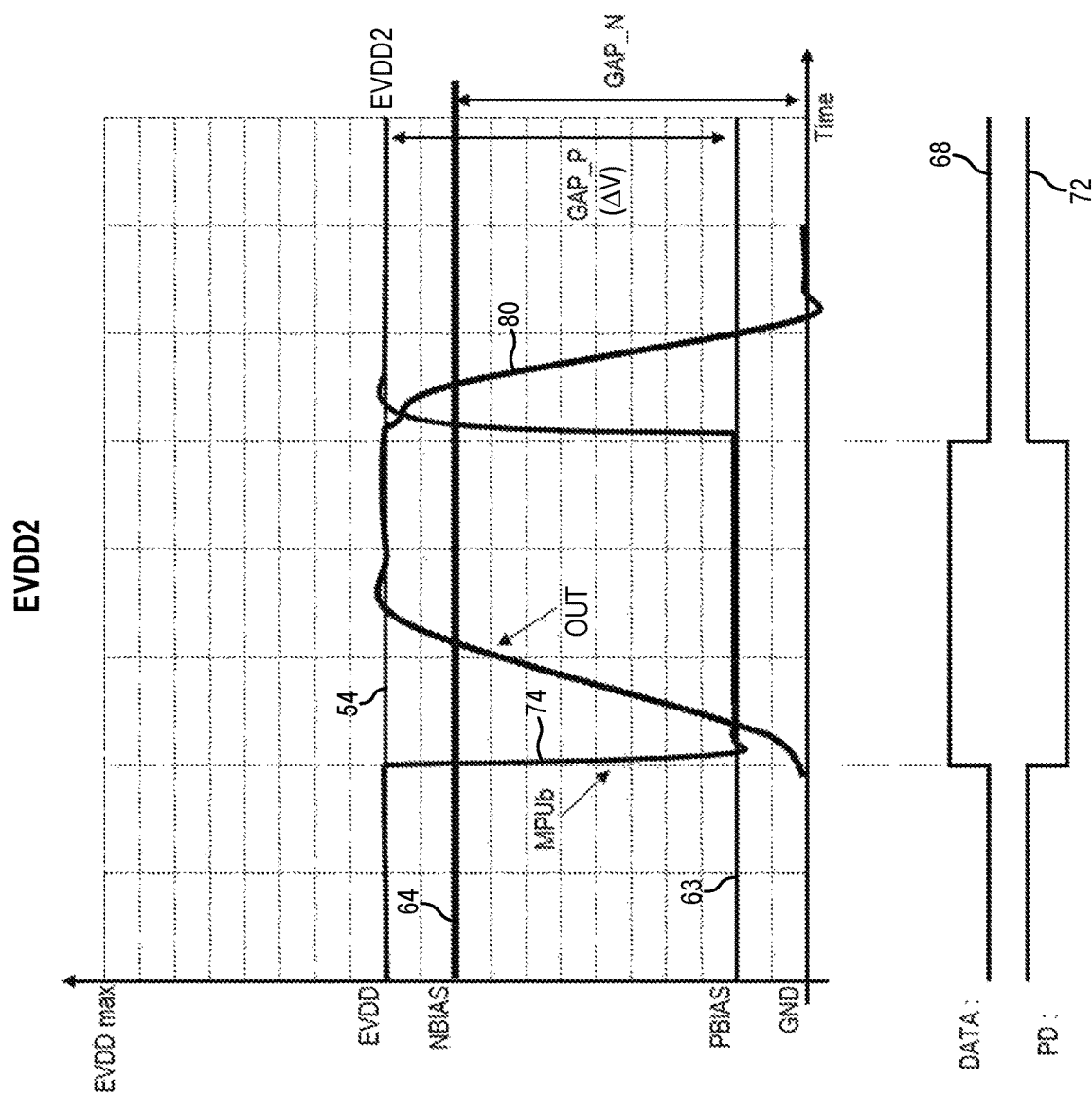

FIGS. 10-12 are plots illustrating operational examples of the output circuit of FIG. 2 in some embodiments. Referring to FIG. 10, the bias voltage NBIAS (curve 64) and the bias voltage PBIAS (curve 63) are selected as shown. FIG. 11 illustrates the operation waveforms for an EVDD voltage at the EVDD1 value. FIG. 12 illustrates the operation waveforms for an EVDD voltage at the EVDD2 value. Referring to FIG. 11, with the EVDD at the EVDD1 voltage value near the maximum EVDD, the bias voltage PBIAS (curve 63) is a gap voltage GAP_P (or $\Delta$V) below the EVDD voltage. The modified pull-up signal MPUb (curve 74) swings between the PBIAS voltage and the EVDD voltage. The output signal OUT (curve 80) swings between the ground voltage and the EVDD voltage. Referring to FIG. 12, with the EVDD at the EVDD2 voltage value near the minimum EVDD, the bias voltage PBIAS (curve 63) is a gap voltage GAP_P (or ΔV) below the EVDD voltage. The modified pull-up signal MPUb (curve 74) swings between the PBIAS voltage and the EVDD voltage. The output signal OUT (curve 80) swings between the ground voltage and the EVDD voltage.

Figure 13:
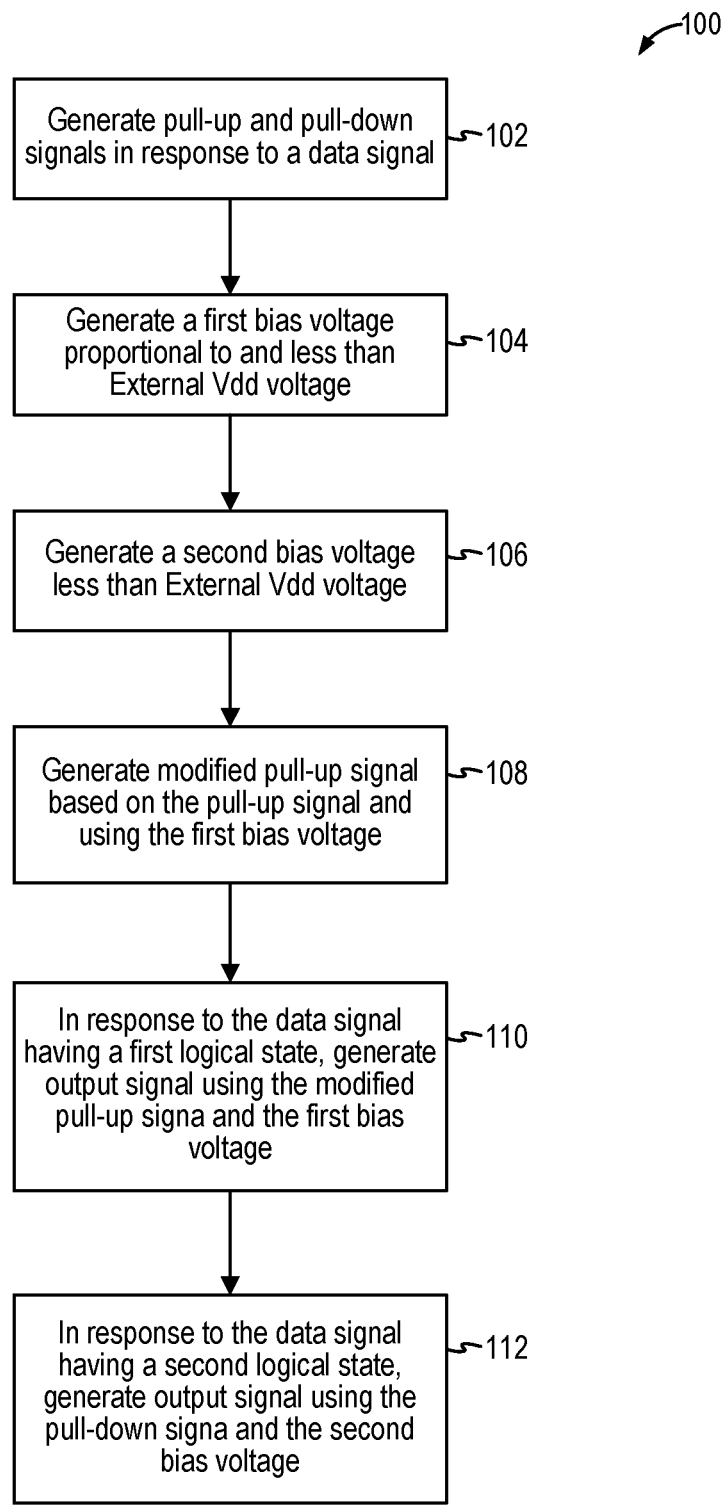
FIG. 13 is a flowchart illustrating a method for generating an output signal in some embodiments.

FIG. 13 is a flowchart illustrating a method for generating an output signal in some embodiments. A method 100 is configured to generate an output signal on an output node in response to a data signal where the data signal is biased within a first voltage range associated with a first power supply voltage and the output signal is biased within a second voltage range associated with a second power supply voltage larger than the first power supply voltage. Referring to FIG. 13, the method 100 includes generating a pull-up signal and a pull-down signal in response to the data signal, the pull-up signal and the pull-down signal being biased within the first voltage range (102). The method 100 then generates a first bias voltage being proportional to and a given voltage value less than the second power supply voltage (104). The method 100 further generates a second bias voltage having a voltage value within the second voltage range (106). The method 100 generates a modified pull-up signal having same logical states as the pull-up signal and being biased within a third voltage range between the first bias voltage and the second power supply voltage (108). In response to the data signal having a first logical state, the method 100 generate, using the modified pull-up signal and the first bias voltage, the output signal on the output node having a voltage value indicative of the second power supply voltage (110). In response to the data signal having a second logical state, the method 100 generates, using the pull-down signal and the second bias voltage, the output signal on the output node being the ground potential (112).

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. An output circuit generating an output signal on an output node in response to a data signal, the data signal being biased within a first voltage range associated with a first power supply voltage and the output signal being biased within a second voltage range associated with a second power supply voltage greater than the first power supply voltage, the output circuit comprising:
   an output buffer circuit receiving the data signal and generating a pull-up signal and a pull-down signal in response to the data signal, the pull-up signal and the pull-down signal being biased within the first voltage range;
   a pull-up bias controller receiving the pull-up signal and a voltage indicative of a first bias voltage and generating a modified pull-up signal having same logical states as the pull-up signal and being biased to the first bias voltage in response to the data signal having a first logical state and being biased to the second power supply voltage in response to the data signal having a second logical state, the first bias voltage being less than the second power supply voltage by a given voltage value; and
   an output driver circuit comprising an active pull-up circuit connected between the second power supply voltage and the output node, and an active pull-down circuit connected between the output node and a ground potential, the pull-up circuit receiving the modified pull-up signal and the first bias voltage and the pull-down circuit receiving the pull-down signal and a second bias voltage having a voltage value within the second voltage range,
   wherein in response to the data signal having the first logical state, the modified pull-up signal is biased to the first bias voltage and the pull-up circuit of the output driver circuit is being driven by the modified pull-up signal and the first bias voltage to generate the output signal on the output node having a voltage value indicative of the second power supply voltage; and in response to the data signal having the second logical state, the modified pull-up signal is biased to the second power supply voltage to turn off the active pull-up circuit and the pull-down circuit of the output driver circuit is being driven by the pull-down signal and the second bias voltage to generate the output signal on the output node being the ground potential.

2. The output circuit of claim 1, further comprising:
   a reference voltage generator being biased by the second voltage range and generating a first reference voltage being a first voltage value less than the second power supply voltage and generating a second reference voltage having a fix voltage value within the second voltage range; and
   a DC bias driver circuit receiving the first reference voltage to generate the first bias voltage, and receiving the second reference voltage to generate the second bias voltage, the first bias voltage indicative of the first reference voltage and the second bias voltage being indicative of the second reference voltage,
   wherein the pull-up bias controller receives the first reference voltage as the voltage indicative of the first bias voltage.

3. The output circuit of claim 1, wherein the output driver circuit comprises:
   the pull-up circuit comprising a first transistor and a second transistor of a first conductivity type connected in series between the second power supply voltage and the output node, the first transistor having a control terminal coupled to the modified pull-up signal and the second transistor having a control terminal coupled to the first bias voltage; and the pull-down circuit comprising a third transistor and a fourth transistor of a second conductivity type connected in series between the output node and the ground potential, the third transistor having a control terminal coupled to the first bias voltage and the fourth transistor having a control terminal coupled to the pull-down signal.

4. The output circuit of claim 3, wherein the first, second, third and fourth transistors are configured for operation within the first voltage range.

5. The output circuit of claim 3, wherein the first, second, third and fourth transistors are thin gate oxide transistors for operating within the first voltage range.

6. The output circuit of claim 3, wherein the first conductivity type comprises P-type conductivity and the second conductivity type comprises N-type conductivity.

7. The output circuit of claim 6, wherein in response to the data signal having the first logical state, the pull-down signal is in a first logical state to deactivate the pull-down circuit and the modified pull-up signal is in a first logical state to activate the pull-up circuit; and in response to the data signal having the second logical state, the pull-down signal is in a second logical state to activate the pull-down circuit and the modified pull-up signal is in a second logical state to deactivate the pull-up circuit.

8. The output circuit of claim 3, wherein the pull-up bias controller comprises:

a fifth transistor of a first conductivity type having a first current terminal coupled to the second power supply voltage, a second current terminal coupled to a first node providing the modified pull-up signal, and a control terminal coupled to receive a signal indicative of the pull-up signal level shifted to the second voltage range;

a sixth transistor of a second conductivity type having a first current terminal coupled to the second power supply voltage through a first resistor, a second current terminal coupled to the first node, and a control terminal coupled to the second power supply voltage;

a seventh transistor of the second conductivity type having a first current terminal coupled to the first node through a second resistor, a second current terminal, and a control terminal coupled to an output terminal of an error amplifier, the error amplifier receiving a voltage indicative of the first bias voltage and a feedback voltage from the first current terminal of the seventh transistor; and an eighth transistor of the second conductivity type having a first current terminal coupled to the second current terminal of the seventh transistor, a second current terminal coupled to the ground potential, and a control terminal coupled to receive a signal indicative of the pull-up signal level.

9. The output circuit of claim 8, wherein in response to the data signal having the first logical state, the pull-up signal has a first logical state to turn on the eighth transistor and to turn off the fifth transistor, the modified pull-up signal being generated to have the first logical state of the pull-up signal and having a voltage value indicative of the first bias voltage, and wherein in response to the data signal having the second logical state, the pull-up signal has a second logical state to turn off the eighth transistor and to turn on the fifth transistor, the modified pull-up signal being generated to have the second logical state of the pull-up signal and having a voltage value indicative of the second power supply voltage.

10. The output circuit of claim 8, wherein the first, second, third and fourth transistors are configured for operation within the first voltage range and the fifth, sixth, seventh and eighth transistors are configured for operation within the second voltage range.

11. The output circuit of claim 8, wherein the first, second, third and fourth transistors are thin gate oxide transistors for operating within the first voltage range and the fifth, sixth, seventh and eighth transistors are thick gate oxide transistors for operating within the second voltage range, the gate oxide thickness of the first, second, third and fourth transistors being thinner than the gate oxide thickness of the fifth, sixth, seventh and eighth transistors.

12. The output circuit of claim 10, wherein the first, second, third and fourth transistors are low voltage transistors configured for operation within the 2.0 volts range and the fifth, sixth, seventh and eighth transistors are high voltage transistors configured for operation within the 3.6 volts range, the first voltage range being 0 to 2V and the second voltage range being 0 to 3.6V, the first bias voltage being 1.6V less than the second power supply voltage of 3.6V and the second bias voltage being a fixed voltage value of 2V.

13. The output circuit of claim 1, wherein the first bias voltage has a voltage value less than and proportional to the second power supply voltage and the second bias voltage has a fixed voltage value less than the second power supply voltage.

14. A method for generating an output signal on an output node in response to a data signal, the data signal being biased within a first voltage range associated with a first power supply voltage and the output signal being biased within a second voltage range associated with a second power supply voltage greater than the first power supply voltage, the method comprising:

generating a pull-up signal and a pull-down signal in response to the data signal, the pull-up signal and the pull-down signal being biased within the first voltage range;

generating a first bias voltage being proportional to and less than the second power supply voltage by a given voltage value and a second bias voltage having a voltage value within the second voltage range;

generating a modified pull-up signal having same logical states as the pull-up signal and being biased to the first bias voltage in response to the data signal having a first logical state and being biased to the second power supply voltage in response to the data signal having a second logical state;

in response to the data signal having the first logical state and the modified pull-up signal being biased to the first bias voltage, generating, using the modified pull-up signal and the first bias voltage, the output signal on the output node having a voltage value indicative of the second power supply voltage; and in response to the data signal having the second logical state and the modified pull-up signal being biased to the second power supply voltage, generating, using the pull-down signal and the second bias voltage, the output signal on the output node being the ground potential.

15. The method of claim 14, wherein generating, using the modified pull-up signal and the first bias voltage, the output signal on the output node having a voltage value indicative of the second power supply voltage comprises:

generating the output signal using first and second transistors of the first conductivity type connected in series between the second power supply voltage and the output node, the first transistor having a control terminal coupled to the modified pull-up signal and the second transistor having a control terminal coupled to the first bias voltage.

16. The method of claim 15, wherein generating, using the pull-down signal and the second bias voltage, the output signal on the output node being the ground potential comprises:

generating the output signal using third and fourth transistors of a second conductivity type connected in series between the output node and the ground potential, the third transistor having a control terminal coupled to the first bias voltage and the fourth transistor having a control terminal coupled to the pull-down signal.

17. The method of claim 16, wherein the first, second, third and fourth transistors are configured for operation within the first voltage range.

18. The method of claim 16, wherein:

in response to the data signal having the first logical state, generating the pull-down signal in a first logical state to deactivate the third and fourth transistors and generating the modified pull-up signal in a first logical state to activate the first and second transistors; and in response to the data signal having the second logical state, generating the pull-down signal in a second logical state to activate the third and fourth transistors and generating the modified pull-up signal in a second logical state to deactivate the first and second transistors.

19. The method of claim 16, wherein the first conductivity type comprises P-type conductivity and the second conductivity type comprises N-type conductivity.

20. The method of claim 14, wherein the first bias voltage has a voltage value less than and proportional to the second power supply voltage and the second bias voltage has a fixed voltage value less than the second power supply voltage.

* * * * *